United States Patent
Reynov et al.

(10) Patent No.: US 10,109,959 B1
(45) Date of Patent: Oct. 23, 2018

(54) ELECTRICAL CONNECTOR WITH EMBEDDED PROCESSOR

(71) Applicant: Juniper Networks, Inc., Sunnyvale, CA (US)

(72) Inventors: Boris Reynov, Cupertino, CA (US); Jack W. Kohn, Mountain View, CA (US); Shreeram Siddhaye, Sunnyvale, CA (US); Venkata S. Raju Penmetsa, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 17 days.

(21) Appl. No.: 15/605,214

(22) Filed: May 25, 2017

(51) Int. Cl.
| | |
|---|---|
| *H01R 13/66* | (2006.01) |
| *G06F 1/18* | (2006.01) |
| *H05K 7/14* | (2006.01) |
| *H05K 1/18* | (2006.01) |

(52) U.S. Cl.
CPC ........... *H01R 13/665* (2013.01); *G06F 1/181* (2013.01); *H01R 13/6658* (2013.01); *H05K 1/18* (2013.01); *H05K 7/1427* (2013.01); *H05K 2201/10189* (2013.01)

(58) Field of Classification Search
CPC .................................................. H01R 13/665
See application file for complete search history.

(56) References Cited

U.S. PATENT DOCUMENTS

| | | | | |
|---|---|---|---|---|
| 5,335,146 A | * | 8/1994 | Stucke | H05K 1/14 174/260 |
| 5,587,884 A | * | 12/1996 | Raman | H01R 13/665 333/182 |
| 5,647,767 A | * | 7/1997 | Scheer | H01R 13/6658 439/620.17 |
| 6,875,031 B1 | | 4/2005 | Korsunsky et al. | |
| 6,932,649 B1 | * | 8/2005 | Rothermel | H01R 13/6658 439/620.01 |
| 7,225,065 B1 | * | 5/2007 | Hunt | B60R 16/0207 701/33.2 |
| 7,359,371 B2 | * | 4/2008 | Emley | H04M 1/723 370/352 |
| 7,581,990 B2 | | 9/2009 | Kirk et al. | |
| 2003/0194912 A1 | * | 10/2003 | Ferentz | H01R 13/6658 439/676 |

(Continued)

OTHER PUBLICATIONS

Wikipedia, "Electrical connector", https://en.wikipedia.org/wiki/Electrical_connector, May 21, 2017, 11 pages.

(Continued)

*Primary Examiner* — James Harvey
(74) *Attorney, Agent, or Firm* — Harrity & Harrity, LLP

(57) ABSTRACT

An apparatus may comprise a board that can mechanically support one or more components of the apparatus. The one or more components may include a processor to process a signal received or provided via the apparatus. The apparatus may comprise one or more sets of contacts via which the processor is to receive or provide the signal. The one or more sets of contacts may be associated with permitting the apparatus to function as a connector. The apparatus may comprise one or more electrical connections that provide connectivity between the processor and the one or more sets of contacts.

20 Claims, 3 Drawing Sheets

(56) References Cited

U.S. PATENT DOCUMENTS

| | | | |
|---|---|---|---|
| 2009/0063140 A1* | 3/2009 | Villemoes | G10L 19/0204 |
| | | | 704/211 |
| 2010/0245295 A1* | 9/2010 | Kimpara | G06F 3/0418 |
| | | | 345/179 |
| 2012/0258628 A1* | 10/2012 | Huang | B60R 16/0232 |
| | | | 439/620.21 |
| 2014/0213111 A1* | 7/2014 | Chang | H01R 13/6658 |
| | | | 439/620.15 |
| 2014/0307809 A1* | 10/2014 | Lo | H04B 3/28 |
| | | | 375/257 |
| 2016/0233922 A1 | 8/2016 | Huang et al. | |

OTHER PUBLICATIONS

Wikipedia, "Repeater insertion", https://en.wikipedia.org/wiki/Repeater_insertion, Jul. 3, 2014, 2 pages.

* cited by examiner

ELECTRICAL CONNECTOR WITH EMBEDDED PROCESSOR

BACKGROUND

An electrical connector may include an electro-mechanical device used to join electrical terminations and create an electrical circuit. An electrical connector may be described as male-ended (e.g., consisting of plugs) or female-ended (e.g., consisting of jacks). A connection created using an electrical connector may be temporary, as for portable equipment, need a tool for assembly and removal, or serve as a permanent electrical joint between two wires or devices. An adapter can be used to connect two or more dissimilar electrical connectors.

SUMMARY

According to some possible implementations, an apparatus may comprise a housing to mechanically support one or more components of the apparatus. The housing may permit the apparatus to function as an electrical connector. The apparatus may comprise a processor that permits the apparatus to process a signal that is received or provided via the apparatus. The processor may be mechanically supported within the housing of the apparatus. The apparatus may comprise one or more contacts that permit the apparatus to mate with another component or another apparatus. The one or more contacts may permit the processor to receive or provide the signal. The one or more contacts may be mechanically supported within the housing of the apparatus.

According to some possible implementations, a connector may comprise a housing. The connector may comprise a board within the housing that is mechanically supported by the housing. The connector may comprise a processor mechanically supported by the board. The processor may be capable of processing a signal provided or received via the connector. The connector may comprise one or more electrical connections mechanically supported by the board. The one or more electrical connections may provide electrical connectivity between the processor and one or more other components of the connector. The connector may comprise one or more sets of contacts connected to the processor via the one or more electrical connections. The one or more sets of contacts may provide connectivity between the processor and at least one of another connector, or a component of a device with which the connector is associated.

According to some possible implementations, an apparatus may comprise a board that can mechanically support one or more components of the apparatus. The one or more components may include a processor to process a signal received or provided via the apparatus. The apparatus may comprise one or more sets of contacts via which the processor is to receive or provide the signal. The one or more sets of contacts may be associated with permitting the apparatus to function as a connector. The apparatus may comprise one or more electrical connections that provide connectivity between the processor and the one or more sets of contacts.

DETAILED DESCRIPTION

The following detailed description of example implementations refers to the accompanying drawings. The same reference numbers in different drawings may identify the same or similar elements.

Increased switching speed in a networking system limits signal propagation distance on a printed circuit board (PCB) and/or between PCBs in a multi-PCB system. A design engineer may use a device, such as a repeater, a re-timer, an amplifier, and/or a re-generator, to increase signal propagation distance and thereby connect components (e.g., processors) on one or more PCBs. Using such a device may consume space on a PCB, thereby limiting an amount of space on the PCB for other components, such as electrical connectors (e.g., high-speed connectors), increasing a cost of the PCB (e.g., via a larger PCB, via a PCB with additional layers, etc.), and/or the like.

Some implementations, described herein, provide an electrical connector comprising a processor (e.g., within a housing of the electrical connector rather than on a PCB connected to the electrical connector). For example, the processor may function as a repeater, a re-timer, an amplifier, and/or a re-generator to increase signal propagation distance of a signal received and/or provided via the electrical connector. In this way, a network system may have an increased signal propagation distance without having a repeater, a re-timer, an amplifier, and/or a re-generator on the same PCB to which the electrical connector is connected. This conserves space on the PCB while improving signal quality via increased signal propagation distance, reduces a cost of the PCB, and/or the like. In addition, some implementations, described herein, provide an electrical connector with contacts that are shorter relative to an electrical connector that does not comprise a processor. This reduces signal loss related to contact length or size, increases system volume utilization, and/or the like.

Figure 1:
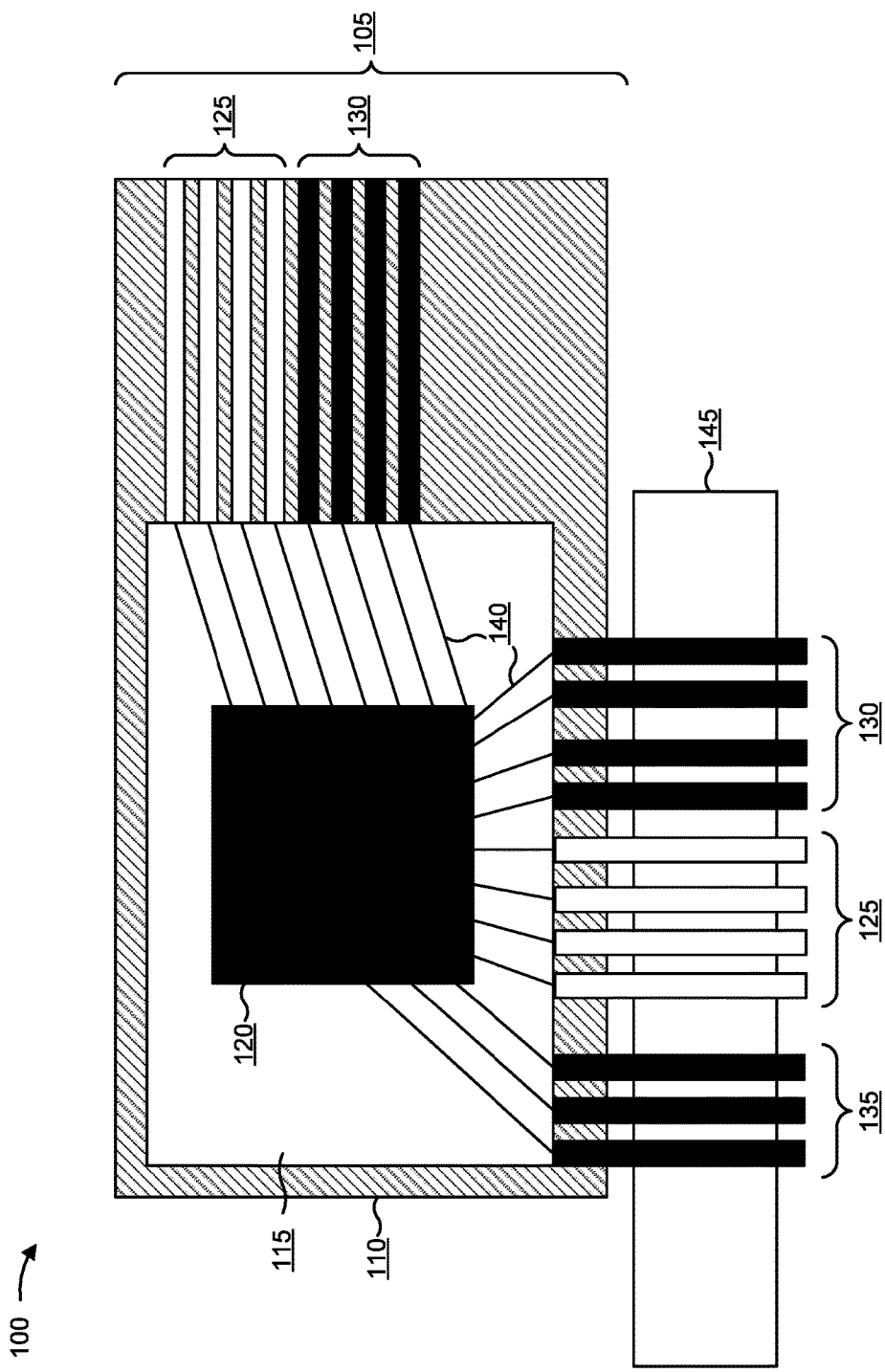
FIG. 1 is a diagram of an overview of an example apparatus, and example components thereof, described herein.

FIG. 1 is a diagram of an overview of an example apparatus 100 described herein. In addition, FIG. 1 is a diagram of example components of apparatus 100. In some implementations, apparatus 100 may include one or more apparatus 100 and/or one or more components of apparatus 100. FIG. 1 shows a side view and cross section of example apparatus 100 (e.g., a cross section of a housing of apparatus 100 (stripped lines) and internal components of apparatus 100).

As shown, apparatus 100 may include electrical connector 105, housing 110, board 115, processor 120, a set of transmitter (TX) contacts 125 (referred to hereinafter collectively as "TX contacts 125" and individually as "TX contact 125"), a set of receiver (RX) contacts 130 (referred to hereinafter collectively as "RX contacts 130" and individually as "RX contact 130"), a set of auxiliary contacts 135 (referred to hereinafter collectively as "auxiliary contacts 135" and individually as "auxiliary contact 135"), a set of electrical connections 140 (referred to hereinafter collectively as "electrical connections 140" and individually as "electrical connection 140"), and/or printed circuit board (PCB) 145.

Electrical connector 105 includes one or more components (e.g., an electro-mechanical device) used to join electrical terminations and create an electric circuit. For example, electrical connector 105 may include a high-speed connector, a backplane connector, an optical fiber connector, and/or a similar type of component. In some implementations, electrical connector 105 may include one or more components. For example, and as shown in FIG. 1, electrical connector 105 may include housing 110, board 115, processor 120, TX contacts 125, RX contacts 130, auxiliary contacts 135, and/or electrical connections 140.

In some implementations, electrical connector 105 may be male-ended, female-ended, a combination of male-ended and female-ended (e.g., where a first end of electrical connector 105 is male-ended and a second end of electrical connector 105 is female ended), and/or genderless. In some implementations, electrical connector 105 may connect to PCB 145 and/or another electrical connector 105. For example, a first end of a first electrical connector 105 may connect to PCB 145 (as shown in FIG. 1) and a second end of the first electrical connector 105 may connect to an end of a second electrical connector 105 (e.g., which may be connected to another PCB 145, or a different portion of the same PCB 145), as described in more detail elsewhere herein. In this way, electrical connector 105 may provide connectivity between components on two or more PCBs 145, or on different portions of the same PCB 145.

In some implementations, electrical connector 105 may be used in a high-speed networking context (e.g., a network with a speed of 25 gigabits per second and higher). For example, electrical connector 105 may include a high-speed electrical connector 105 for use with Ethernet, Gigabit, Fibre Channel, and/or the like. Additionally, or alternatively, electrical connector 105 may be used within, or in association with, a device. For example, electrical connector 105 may be used within, or in association with, a router, a switch, a gateway, a modem, a server, a computer, and/or the like.

Housing 110 includes one or more components that mechanically support one or more other components of electrical connector 105. For example, housing 110 may include a casing, a covering, a case, a holder, a sheath, a jacket, a shell, a capsule, or a similar type of component. In some implementations, housing 110 may include a locking mechanism (e.g., a locking lever, a screw lock, a toggle lock, or a bayonet lock) to securely connect electrical connector 105 to another electrical connector 105, PCB 145, a connector header (e.g., which PCB 145 mechanically supports), and/or the like. In this way, housing 110 may permit electrical connector 105 to function as an electrical connector.

Board 115 includes one or more components that mechanically support one or more other components (e.g., within housing 110). For example, board 115 may include a PCB (e.g., similar to PCB 145), a plate (e.g., a plastic plate or a ceramic plate), or a similar type of component. In some implementations, board 115 may mechanically support processor 120, a TX contact 125, an RX contact 130, an auxiliary contact 135, and/or electrical connections 140, so as to provide processor 120 with connectivity to TX contacts 125, RX contacts 130, and/or auxiliary contacts 135, via electrical connections 140, as described in more detail elsewhere herein.

Processor 120 is implemented as hardware, firmware, or a combination of hardware and software. Processor 120 may include an integrated circuit, an application-specific integrated circuit (ASIC) (e.g., a repeater ASIC, a re-timer ASIC, an amplifier ASIC, or a re-generator ASIC), a central processing unit (CPU), a graphics processing unit (GPU), an accelerated processing unit (APU), a microprocessor, a microcontroller, a digital signal processor (DSP), a field-programmable gate array (FPGA), or another type of processing component. In some implementations, processor 120 includes one or more processors capable of being programmed to perform a function. In some implementations, processor 120 may include an active component. As such, processor 120 may be supplied with power, may be programmed, may be controlled by a device and/or another component, and/or the like, as described elsewhere herein.

As shown in FIG. 1, electrical connector 105 includes processor 120 within housing 110. This reduces or eliminates a need for PCB 145 to mechanically support processor 120, thereby conserving space on PCB 145, reducing a cost associated with PCB 145 (e.g., via a smaller PCB 145 and/or PCB 145 with fewer layers, relative to another PCB 145 that mechanically supports processor 120), and/or the like. In addition, having board 115, processor 120, and/or electrical connections 140 within housing 110 may permit electrical connector 105 to have smaller or shorter connection lengths relative to another electrical connector 105 that does include board 115, processor 120, and/or electrical connections 140 within housing 110. This reduces signal loss due to connection length, increases system volume utilization, and/or the like.

In some implementations, when electrical connector 105 is connected to PCB 145 (e.g., via a connector header), processor 120 may receive a signal from PCB 145, and may repeat, re-time, amplify, re-generate, or otherwise process the signal, such as to improve the signal, increase a signal propagation distance of the signal, and/or the like. In this way, processor 120 may process a signal that is received or provided via electrical connector 105, such as to improve the signal.

In some implementations, electrical connector 105 may include an additional or different component than processor 120. For example, electrical connector 105 may include a memory component (e.g., flash memory), a transceiver component (or separate transmitter and receiver components), and/or the like. In this way, electrical connector 105 may facilitate removal of additional components from PCB 145, thereby conserving space on PCB 145.

TX contact 125 includes one or more components (e.g., one or more electrical circuit components) comprising electrically conductive material (e.g., metal) that can pass an electrical current when contacted with another TX contact 125. For example, TX contact 125 may include a pin, a socket, a plug, a receptacle, a blade, a push-on terminal, a crimp, a fork terminal, a split bolt, a ring, a spade, a wire, a post, a universal serial bus (USB) plug, or a similar type of component. In some implementations, TX contact 125 may include a male contact, a female contact, and/or a genderless contact. In some implementations, TX contact 125 may be connected to a wire or another component used to transmit a signal. In some implementations, TX contact 125 may be used to transmit a signal from a component on PCB 145 to another component on the same or a different PCB 145.

RX contact 130 includes one or more components (e.g., one or more electrical circuit components) comprising electrically conductive material (e.g., metal) that can pass an electrical current when contacted with another RX contact 130. For example, RX contact 130 may include a pin, a socket, a plug, a receptacle, a blade, a push-on terminal, a crimp, a fork terminal, a split bolt, a ring, a spade, a wire, a post, a USB plug, or a similar type of component. In some implementations, RX contact 130 may include a male contact, a female contact, and/or a genderless contact. In some implementations, RX contact 130 may be connected to a wire or another component used to receive a signal. In some implementations, RX contact 130 may be used to receive a signal from a component on the same or a different PCB 145.

Auxiliary contact 135 includes one or more components (e.g., one or more electrical circuit components) comprising electrically conductive material (e.g., metal) that can pass an electrical current when contacted with another auxiliary contact 135. For example, auxiliary contact 135 may include a pin, a socket, a plug, a receptacle, a blade, a push-on terminal, a crimp, a fork terminal, a split bolt, a ring, a spade, a wire, a post, a USB plug, or a similar type of component. In some implementations, auxiliary contact 135 may include a male contact, a female contact, and/or a genderless contact.

In some implementations, auxiliary contact 135 may be connected to a power supply used to provide power to processor 120. Additionally, or alternatively, auxiliary contact 135 may be connected to a component or device that can program processor 120 to perform a function, control operation of processor 120, and/or the like. In this way, auxiliary contact 135 permits processor 120 to perform, for example, repeating, re-timing, amplifying, and/or re-generating functions, thereby permitting processor 120 to improve a signal by increasing a signal propagation distance of a signal such that the signal propagation distance satisfies a threshold.

In some implementations, TX contacts 125, RX contacts 130, and/or auxiliary contacts 135 may permit electrical connector 105 to mate with another component (e.g., a connector header or PCB 145). In some implementations, TX contacts 125, RX contacts 130, and/or auxiliary contacts 135 may be combined into a single type of contact (e.g., a transceiver contact that can receive a signal and/or provide a signal). In some implementations, TX contacts 125, RX contacts 130, and/or auxiliary contacts 135 may provide connectivity between processor 120 and another electrical connector 105 or a component of a device, such as a power source, PCB 145, and/or the like (e.g., when mated with the other electrical connector 105 or the device). In this way, TX contacts 125, RX contacts 130, and/or auxiliary contacts 135 may be associated with permitting electrical connector 105 to function as an electrical connector.

Electrical connection 140 includes one or more components (e.g., one or more electrical circuit components) comprising electrically conductive material that permit electric current to flow between two or more other components. For example, electrical connection 140 may include a wire (e.g., a stranded copper wire), a cable (e.g., a coaxial cable, an optical cable, etc.), or a similar type of component. In some implementations, electrical connection 140 may provide an electrical connection between two or more components of electrical connector 105. For example, electrical connection 140 may provide electrical connectivity between processor 120 and TX contact 125, RX contact 130, and/or auxiliary contact 135. In this way, electrical connection 140 permits processor 120 to receive a signal for processing, to receive power, to be programmed, to be controlled, and/or the like. In some implementations, another component may include electrical connection 140. For example, TX contact 125, RX contact 130, and/or auxiliary contact 135 may include one or more electrical connections 140.

PCB 145 includes one or more components capable of mechanically supporting or electrically connecting other components (e.g., electronic components of electrical connector 105). For example, PCB 145 may include a circuit board, a mother board, a single-sided PCB, a double-sided PCB, a multi-layer PCB, or a similar type of component. In some implementations, PCB 145 may enable communications between electrical connector 105 and one or more components that PCB 145 is mechanically supporting. For example, PCB 145 may connect TX contact 125, RX contact 130, and/or auxiliary contact 135 to one or more components of a device.

In some implementations, electrical connector 105 may have a particular shape. For example, electrical connector 105 may be generally cube shaped, hyperrectangle shaped, or box shaped. In some implementations, electrical connector 105 may have a set of dimensions. For example, a length, a width, and/or a height of electrical connector 105 may be in a range from one centimeter (cm) to 13 cm (e.g., in a range from 3 cm to 6 cm, approximately 10 cm, approximately 1cm, etc.).

In this way, some implementations, described herein, provide an electrical connector comprising a processor (e.g., within a housing of the electrical connector rather than on a PCB connected to the electrical connector). This permits increased signal propagation distance without having a repeater, a re-timer, an amplifier, and/or a re-generator on the same PCB to which the electrical connector is connected. This conserves space on the PCB while improving signal quality via increased signal propagation distance, reduces a cost of the PCB, and/or the like. In addition, in this way, some implementations provide an electrical connector with contacts that are smaller or shorter relative to an electrical connector that does not comprise a processor. This reduces signal loss related to contact length or size, increases system volume utilization, and/or the like.

As indicated above, FIG. 1 is provided merely as an example. Other examples are possible and may differ from what was described with regard to FIG. 1. In addition, the number and arrangement of components shown in FIG. 1 are provided as an example. In practice, apparatus 100 may include additional components, fewer components, different components, or differently arranged components than those shown in FIG. 1. Additionally, or alternatively, a set of components (e.g., one or more components) of apparatus 100 may perform one or more functions described as being performed by another set of components of apparatus 100.

Figure 2:
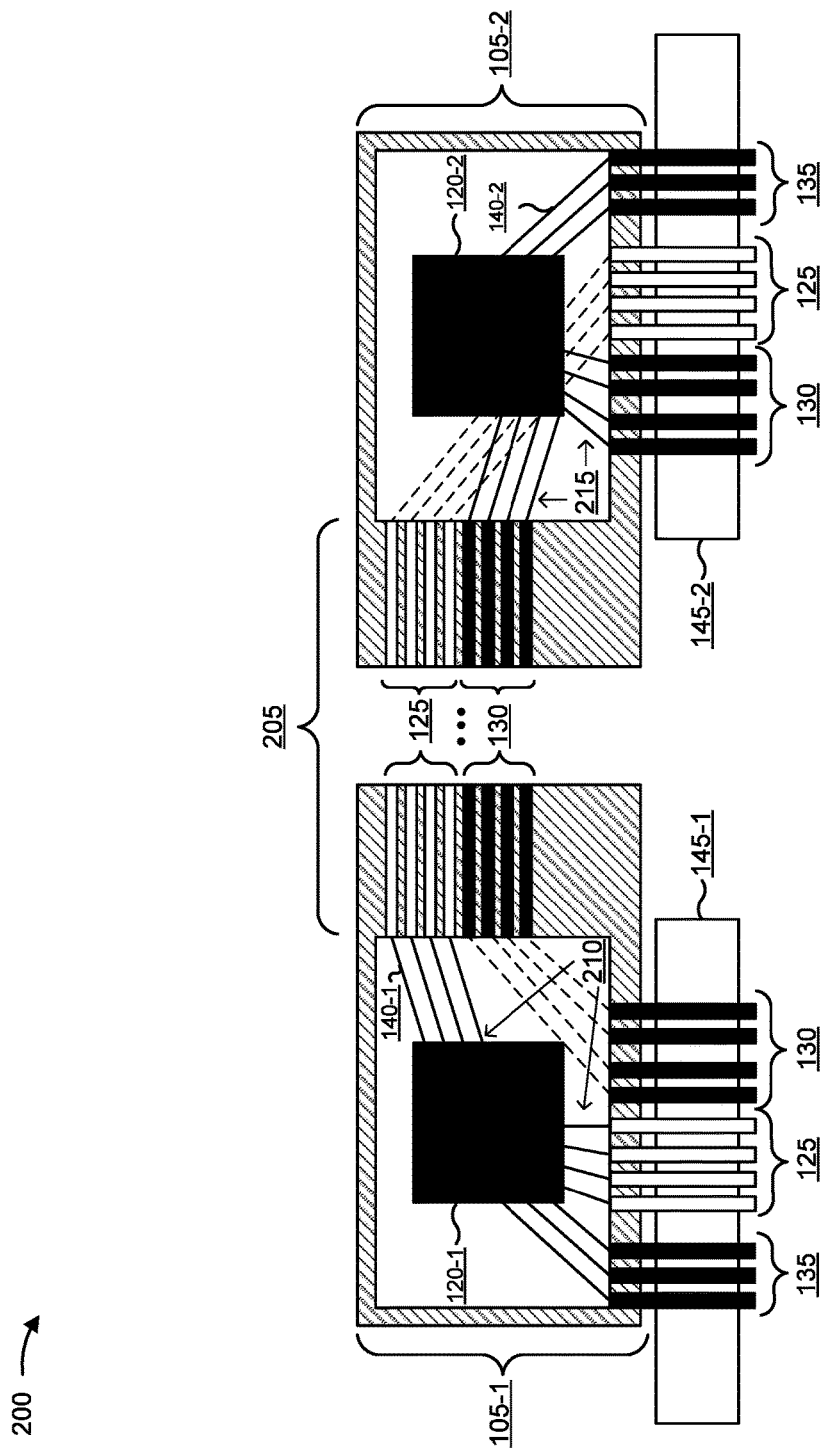
FIG. 2 is a diagram of an example implementation described herein.

FIG. 2 is a diagram of an example implementation 200 in which an electrical connector 105, described herein, may be implemented. As shown in FIG. 2, example implementation 200 may include electrical connectors 105-1 through 105-2 and PCBs 145-1 through 145-2. PCBs 145-1 and 145-2 may be different PCBs 145 or may be different portions of the same PCB 145.

As shown in FIG. 2, and by reference number 205, electrical connector 105-1 may be connected to electrical connector 105-2. For example, TX contacts 125 and/or RX contacts 130 of electrical connector 105-1 may be connected to corresponding TX contacts 125 and/or RX contacts 130 of electrical connector 105-2 (e.g., a straight through configuration, as shown). Conversely, and as another example, TX contacts 125 of electrical connector 105-1 may be connected to RX contacts 130 of electrical connector 105-2, and RX contacts 130 of electrical connector 105-1 may be connected to TX contacts 125 of electrical connector 105-2 (e.g., a cross-over or a roll-over configuration).

In some implementations, electrical connector 105-1 and electrical connector 105-2 may be connected via electrical connections 140 (e.g., via wires). Conversely, in some implementations, an end of electrical connector 105-1 may be physically connected (e.g., mated) to an end of electrical connector 105-2. For example, male contacts of electrical connector 105-1 (e.g., male TX contacts 125 and/or male RX contacts 130) may be mated with female contacts of electrical connector 105-2 (e.g., female TX contacts 125 and/or female RX contacts 130). In this way, PCBs 145-1 and 145-2 may exchange a signal via electrical connectors 105-1 and 105-2.

As shown by reference number 210, processor 120-1, of electrical connector 105-1, may be connected to a subset of components of electrical connector 105-1. For example, when electrical connector 105-1 is on a transmit end of a connection (e.g., an end of a connection where a signal is transmitted), processor 120-1 may be connected to TX contacts 125 and auxiliary contacts 135 of electrical connector 105-1 via electrical connections 140-1. Continuing with the previous example, processor 120-1 may not be connected to RX contacts 130 of electrical connector 105-1 based on electrical connector 105-1 being on a transmit end of a connection. Continuing still with the previous example, RX contacts 130 associated with a first end of electrical connector 105-1 may be directly connected to RX contacts 130 associated with a second end of electrical connector 105-1 (e.g., shown using dashed lines) and may not be connected to processor 120-1. This conserves processing resources of processor 120-1 by preventing processor 120-1 from processing a received signal.

As shown by reference number 215, processor 120-2, of electrical connector 105-2, may be connected to a subset of components of electrical connector 105-2. For example, when electrical connector 105-2 is on a receive end of a connection (e.g., an end of a connection where a signal is received), processor 120-2 may be connected to RX contacts 130 and auxiliary contacts 135 of electrical connector 105-2 via electrical connections 140-2. Continuing with the previous example, processor 120-2 may not be connected to TX contacts 125 of electrical connector 105-2 based on electrical connector 105-2 being on a receive end of a connection. Continuing still with the previous example, TX contacts 125 associated with a first end of electrical connector 105-2 may be directly connected to TX contacts 125 associated with a second end of electrical connector 105-2 (e.g., shown using dashed lines) and may not be connected to processor 120-2. This conserves processing resources of processor 120-2 by preventing processor 120-2 from processing a transmitted signal.

In this way, a first electrical connector 105 may be connected to a second electrical connector 105, thereby providing connectivity between a first PCB 145 and a second PCB 145 (or a first portion of PCB 145 and a second portion of PCB 145).

As indicated above, FIG. 2 is provided merely as an example. Other examples are possible and may differ from what was described with regard to FIG. 2. In addition, the number and arrangement of components shown in FIG. 2 are provided as an example. In practice, implementation 200 may include additional components, fewer components, different components, or differently arranged components than those shown in FIG. 2. Additionally, or alternatively, a set of components (e.g., one or more components) of implementation 200 may perform one or more functions described as being performed by another set of components of implementation 200.

Figure 3:
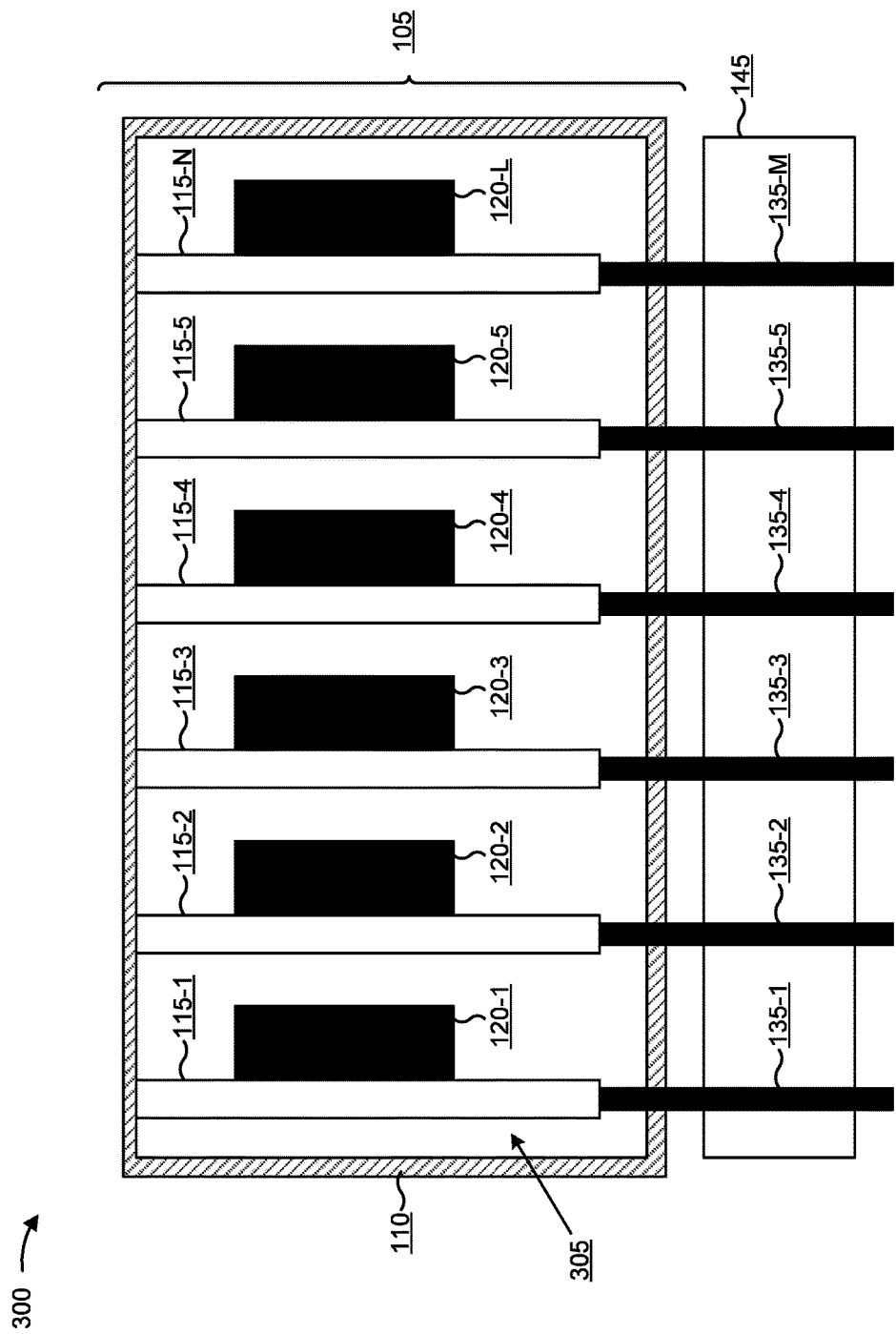
FIG. 3 is a diagram of an example implementation described herein.

FIG. 3 is a diagram of an example implementation 300 in which an electrical connector 105, described herein, may be implemented. FIG. 3 shows a front view and cross section of electrical connector 105 (e.g., a front-view that is rotated 90 degrees about a vertical axis from what is shown in FIG. 1).

As shown in FIG. 3, example implementation 300 may include electrical connector 105, housing 110, boards 115-1 through 115-N (N≥1) (hereinafter referred to collectively as "boards 115" and individually as "board 115"), processors 120-1 through 120-L (L≥1) (hereinafter referred to collectively as "processors 120" and individually as "processor 120"), auxiliary contacts 135-1 through 135-M (M≥1) (hereinafter referred to collectively as "auxiliary contacts 135" and individually as "auxiliary contact 135"), and PCB 145.

As shown in FIG. 3, PCB 145 may mechanically support electrical connector 105. As further shown in FIG. 3, electrical connector 105 may be connected to PCB 145 via auxiliary contacts 135. Additionally, or alternatively, electrical connector 105 may be connected to PCB 145 via TX contacts 125 and/or RX contacts 130 (not shown). TX contacts 125 and RX contacts 130 are not shown in FIG. 3 based on the angle of view of FIG. 3.

As further shown in FIG. 3, and by reference number 305, electrical connector 105 may include multiple boards 115. For example, housing 110 may mechanically support boards 115-1 thorough 115-N (e.g., multiple PCBs similar to PCB 145, multiple plastic plates, etc.). Continuing with the previous example, boards 115-1 through 115-N may mechanically support processors 120-1 through 120-L (e.g., multiple re-timers, multiple repeaters, etc.) and auxiliary contacts 135-1 through 135-N, respectively (e.g., multiple pin contacts, multiple blade contacts, etc.). In this way, electrical connector 105 may include multiple rows and/or columns of contacts (e.g., to form a multi-pin or multi-socket electrical connector).

In some implementations, boards 115-1 through 115-N may be configured in a particular manner. In some implementations, as shown in FIG. 3, boards 115-1 through 115-N may be configured horizontally between a left end of housing 110 and a right end of housing 110. Conversely, in some implementations, boards 115-1 through 115-N may be configured vertically between a bottom end and a top end of housing 110. This permits electrical connector 105 to be configured for a variety of deployment scenarios.

As indicated above, FIG. 3 is provided as an example. Other examples are possible and may differ from what was described with regard to FIG. 3. In addition, the number and arrangement of components shown in FIG. 3 are provided as an example. In practice, implementation 300 may include additional components, fewer components, different components, or differently arranged components than those shown in FIG. 3. Additionally, or alternatively, a set of components (e.g., one or more components) of implementation 300 may perform one or more functions described as being performed by another set of components of implementation 300.

Some implementations, described herein, provide an electrical connector comprising a processor (e.g., within a housing of the electrical connector rather than on a PCB connected to the electrical connector). For example, the processor may function as a repeater, a re-timer, an amplifier, and/or a re-generator to increase signal propagation distance of a signal received and/or provided via the electrical connector. In this way, a network system may have an increased signal propagation distance without having a repeater, a re-timer, an amplifier, and/or a re-generator on the same PCB to which the electrical connector is connected. This conserves space on the PCB while improving signal quality via increased signal propagation distance, reduces a cost of the PCB, and/or the like. In addition, some implementations, described herein, provide an electrical connector with connection lengths that are shorter relative to an electrical connector that does not comprise a processor. This reduces signal loss related to connection length or size, increases system volume utilization, and/or the like.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An apparatus, comprising:
   a housing to mechanically support one or more components of the apparatus,
      the housing permitting the apparatus to function as an electrical connector;
   a processor that permits the apparatus to process a signal that is received or provided via the apparatus,
      the processor including an integrated circuit, and
      the processor being mechanically supported within the housing of the apparatus; and
   a plurality of contacts that permit the apparatus to mate with another component or another apparatus,
      the plurality of contacts permitting the processor to receive or provide the signal,
      the plurality of contacts being mechanically supported within the housing of the apparatus, and
      at least one of the plurality of contacts extending outside the housing for connection to another apparatus.

2. The apparatus of claim 1, where the plurality of contacts comprise:
   one or more first contacts that permit the processor to receive power, to be controlled, or to be programmed,
   one or more second contacts that permit the processor to provide the signal, or
   one or more third contacts that permit the processor to receive the signal.

3. The apparatus of claim 1, where the processor comprises one or more of:
   a first type of processor to repeat the signal,
   a second type of processor to re-time the signal,
   a third type of processor to amplify the signal, or
   a fourth type of processor to regenerate the signal.

4. The apparatus of claim 1, further comprising:
   a board mechanically supported within the housing,
      the board mechanically supporting the processor, one or more of the plurality of contacts, and one or more electrical connections within the housing.

5. The apparatus of claim 4, further comprising:
   one or more electrical connections,
      the one or more electrical connections being mechanically supported by the board within the housing, and
      the one or more electrical connections connecting the processor and the one or more of the plurality of contacts.

6. The apparatus of claim 1, where the apparatus is to be connected to a printed circuit board via one or more of the plurality of contacts, and
   where the processor is to be controlled, programmed, or powered by another signal received via the printed circuit board and the one or more of the plurality of contacts.

7. The apparatus of claim 1, where a first end of the apparatus is to be connected to a printed circuit board, and
   where a second end of the apparatus is to be connected to the other apparatus.

8. A connector, comprising:
   a housing;
   a board within the housing that is mechanically supported by the housing;
   a processor mechanically supported by the board,
      the processor being capable of processing a signal provided or received via the connector, and
      the processor including an integrated circuit;
   one or more electrical connections mechanically supported by the board,
      the one or more electrical connections providing electrical connectivity between the processor and one or more other components of the connector; and
   a plurality of sets of contacts connected to the processor via the one or more electrical connections,
      one or more of the plurality of sets of contacts extending outside the housing to provide connectivity between the processor and at least one of:
         another connector, or
         a component of a device with which the connector is associated.

9. The connector of claim 8, where the processor is connected to:
   a first set of contacts of the plurality of sets of contacts,
      the first set of contacts including one or more contacts that:
         permit the processor to receive the signal,
         permit the processor to provide the signal, and
         permit the processor to be programmed, to be controlled, or to be powered; and
   a second set of contacts of the plurality of sets of contacts,
      the second set of contacts including one or more other contacts that permit the processor to:
         receive the signal, or
         provide the signal.

10. The connector of claim 8, where the processor is connected to a first set of contacts, of the plurality of sets of contacts, associated with one of receiving the signal or providing the signal, and where the processor is not connected to a second set of contacts, of the plurality of sets of contacts, associated with the other of receiving the signal or providing the signal.

11. The connector of claim 8, where the board includes:
a printed circuit board,
a plastic plate, or
a ceramic plate.

12. The connector of claim 8, further comprising:
one or more other boards within the housing that are mechanically supported by the housing,
the one or more other boards mechanically supporting:
one or more other processors,
one or more other sets of contacts, or
one or more other electrical connections.

13. The connector of claim 8, where a first end of the connector is associated with a first set of contacts, of the plurality of sets of contacts, that is different than a second set of contacts, of the plurality of sets of contacts, that is associated with a second end of the connector.

14. The connector of claim 8, where the processor is to:
receive the signal via a first set of contacts, of the plurality of sets of contacts, and one or more first electrical connections of the one or more electrical connections,
the one or more first electrical connections providing connectivity between the first set of contacts and the processor;
process the signal to improve the signal; and
provide the signal via a second set of contacts, of the plurality of sets of contacts, and one or more second electrical connections of the one or more electrical connections,
the one or more second electrical connections providing connectivity between the processor and the second set of contacts.

15. An apparatus, comprising:
a housing;
a board, within the housing, that can mechanically support one or more components of the apparatus,
the one or more components including:
a processor to process a signal received or provided via the apparatus,
the processor including an integrated circuit;
a plurality of sets of contacts via which the processor is to receive or provide the signal,
at least one of the plurality of sets of contacts extending outside the housing to permit the apparatus to function as a connector; and
one or more electrical connections that provide connectivity between the processor and one or more of the plurality of sets of contacts.

16. The apparatus of claim 15, further comprising:
one or more other boards,
the board and the one or more other boards being organized vertically within the housing that mechanically supports the board and the one or more other boards.

17. The apparatus of claim 15, further comprising:
one or more other boards,
the board and the one or more other boards being organized horizontally within the housing that mechanically supports the board and the one or more other boards.

18. The apparatus of claim 15, where a first end of the apparatus is to be connected to a first portion of a first printed circuit board, and
where a second end of the apparatus is to be connected to a second portion of the first printed circuit board via another apparatus or a wire.

19. The apparatus of claim 15, where the processor is associated with one of receiving the signal or providing the signal.

20. The apparatus of claim 15, where
the housing mechanically supports the board, the processor, the one or more of the plurality of sets of contacts, or the one or more electrical connections, and
where the housing is associated with permitting the apparatus to function as the connector.

* * * * *